(12) United States Patent
Han et al.

(10) Patent No.: US 9,166,100 B2
(45) Date of Patent: Oct. 20, 2015

(54) LIGHT EMITTING DEVICE

(75) Inventors: Dae Seob Han, Seoul (KR); Yong Tae Moon, Seoul (KR); Ha Jong Bong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 53 days.

(21) Appl. No.: 13/344,814

(22) Filed: Jan. 6, 2012

(65) Prior Publication Data

US 2012/0104356 A1 May 3, 2012

(30) Foreign Application Priority Data

May 18, 2011 (KR) .......................... 10-2011-0047035

(51) Int. Cl.
*H01L 33/06* (2010.01)
(52) U.S. Cl.
CPC ..................... *H01L 33/06* (2013.01)
(58) Field of Classification Search
CPC .......... H01L 33/04; H01L 33/06; H01L 33/32
USPC .......... 257/13–15, 17, 22, 79, 94, 103
See application file for complete search history.

(56) References Cited

U.S. PATENT DOCUMENTS

| | | | | |
|---|---|---|---|---|
| 5,544,187 A * | 8/1996 | Kadoiwa et al. | ......... | 372/45.012 |
| 5,583,878 A * | 12/1996 | Shimizu et al. | ............ | 372/45.01 |
| 5,932,890 A * | 8/1999 | Irikawa et al. | .................. | 257/15 |
| 6,055,253 A * | 4/2000 | Kidoguchi et al. | ........ | 372/45.01 |
| 6,476,412 B1 * | 11/2002 | Kano | ................ | 257/17 |
| 6,803,597 B2 * | 10/2004 | Watatani et al. | ................ | 257/15 |
| 7,868,316 B2 * | 1/2011 | Yoon et al. | ..................... | 257/15 |
| 7,902,544 B2 * | 3/2011 | Kim et al. | ........................ | 257/13 |
| 2011/0001123 A1 * | 1/2011 | Kim et al. | ........................ | 257/13 |
| 2011/0147700 A1 * | 6/2011 | Son | ................... | 257/13 |
| 2011/0253975 A1 * | 10/2011 | Shatalov et al. | ................ | 257/13 |
| 2011/0272667 A1 * | 11/2011 | Takayama | ....................... | 257/13 |

OTHER PUBLICATIONS

Shan W. et al., 'Dependence of the fundamental band gap of AlxGa1-xN on alloy composition and pressure,' 1999 J Applied Phys 85 (12) p. 8505-8507.*

* cited by examiner

*Primary Examiner* — Bryan Junge
(74) *Attorney, Agent, or Firm* — Ked & Associates, LLP

(57) ABSTRACT

Disclosed is a semiconductor light emitting device. The semiconductor light emitting device includes a light emitting structure having a first conductive semiconductor layer, a second conductive semiconductor layer, and an active layer between the first and second conductive semiconductor layers. The active layer includes a plurality of well layers and barrier layers. An outermost barrier layer of the barrier layers includes a plurality of first layers; and a plurality of second layers.

23 Claims, 12 Drawing Sheets

LIGHT EMITTING DEVICE

The present application claims priority under 35 U.S.C. §119(a) of Korean Patent Application No. 10-2011-0047035 filed on May 18, 2011, which is hereby incorporated by reference in its entirety.

BACKGROUND

The embodiment relates to a light emitting device.

A light emitting diode (LED) is a semiconductor light emitting device that converts current into light. The LED can generate light having high brightness, so that the LED has been extensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device having a novel structure.

The embodiment provides a light emitting device having improved quality and reliability.

The embodiment provides a light emitting device capable of reducing leakage current.

The embodiment provides a light emitting device capable of relaxing strain.

The embodiment provides a light emitting device capable of improving the internal quantum efficiency and the light emitting power.

A light emitting device according to the embodiment includes a light emitting structure including a first conductive semiconductor layer, a second conductive semiconductor layer, and an active layer between the first and second conductive semiconductor layers, wherein the active layer includes a plurality of well layers and barrier layers, and an outermost barrier layer of the barrier layers includes a plurality of first layers; and a plurality of second layers.

DETAILED DESCRIPTION OF THE EMBODIMENTS

Figure 1:
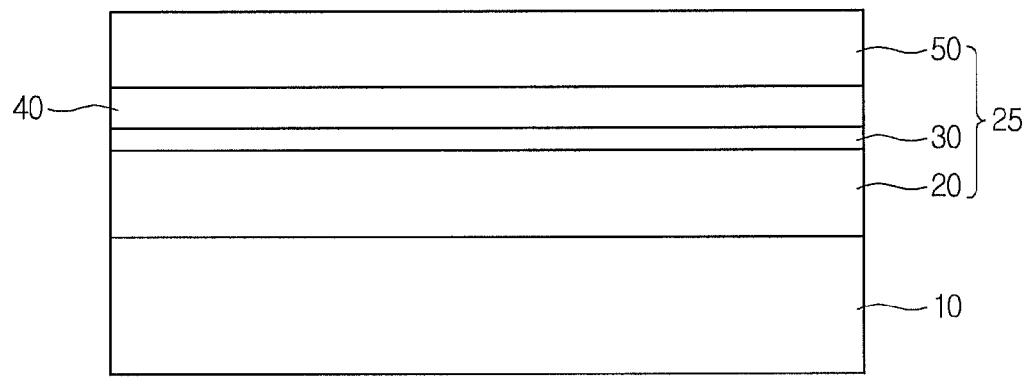
FIG. 1 is a sectional view showing a light emitting device according to the embodiment.

In the description of the embodiments, it will be understood that when a layer (or film), a region, a pattern, or a structure is referred to as being "on" or "under" another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, the embodiments will be described with reference to accompanying drawings. The thickness and size of each layer shown in the drawings may be exaggerated, omitted or schematically drawn for the purpose of convenience or clarity. In addition, the size of elements does not utterly reflect an actual size.

Figure 2:
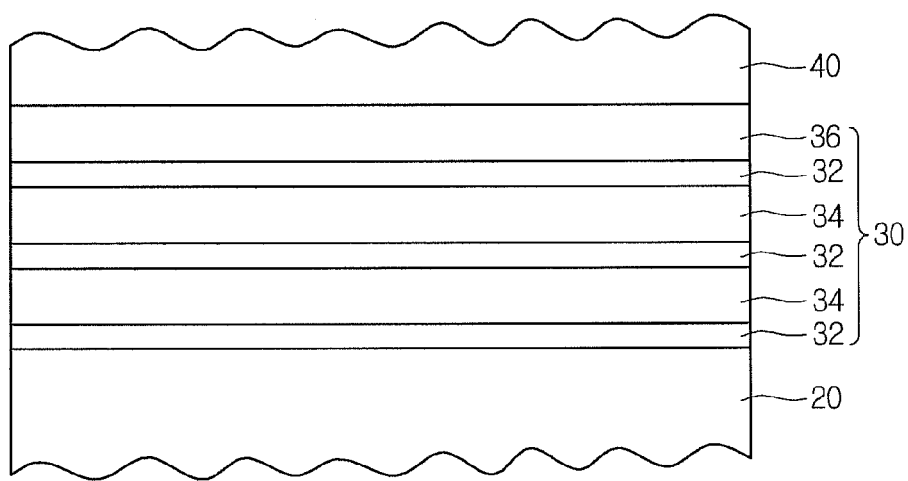
FIG. 2 is an enlarged sectional view showing an active layer of the light emitting device shown in FIG. 1.
Figure 3:
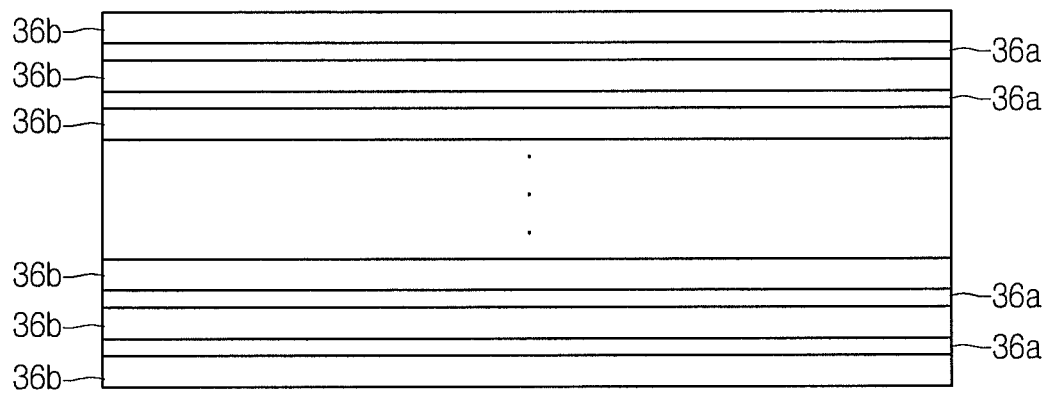
FIG. 3 is a sectional view showing an outermost barrier layer of the active layer shown in FIG. 2.
Figure 4:
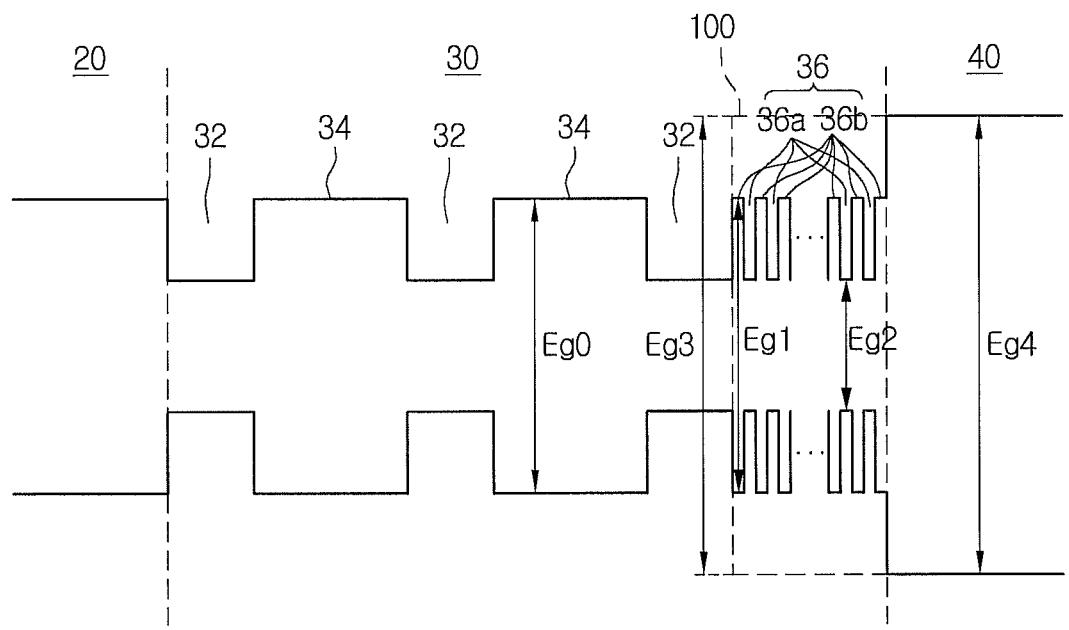
FIG. 4 is an energy band diagram of the light emitting device shown in FIG. 1.

FIG. 1 is a sectional view showing a light emitting device according to the embodiment, FIG. 2 is an enlarged sectional view showing an active layer of the light emitting device shown in FIG. 1, FIG. 3 is a sectional view showing an outermost barrier layer of the active layer shown in FIG. 2 and FIG. 4 is an energy band diagram of the light emitting device shown in FIG. 1.

Referring to FIG. 1, the light emitting device 1 according to the embodiment includes a substrate 10 and a light emitting structure 25 formed on the substrate 10.

The light emitting structure 25 may include a plurality of compound semiconductor layers made from the group III-V compound semiconductor materials. The light emitting structure 25 may grown through one of MOCVD (metal organic chemical vapor deposition), CVD (chemical vapor deposition), PECVD (plasma-enhanced chemical vapor deposition), MBE (molecular beam epitaxy), and HYPE (hydride vapor phase epitaxy).

For instance, the light emitting structure 25 may include a first conductive semiconductor layer 20, an active layer 30 and a second conductive semiconductor layer 50.

The first conductive semiconductor layer 20 is formed on the substrate 10, the active layer is formed on the first conductive semiconductor layer 20, and the second conductive semiconductor layer 50 is formed on the active layer 30.

The substrate 10 may include a material having a superior thermal conductivity. The substrate 10 can include semiconductor material, metal material, composite material, or the combination thereof. For instance, the substrate 10 may include at least one selected from the group consisting of $Al_2O_3$, SiC, Si, GaAs, GaN, ZnO, Si, GaP, InP and Ge.

Although not shown in the drawings, a buffer layer and/or a non-conductive semiconductor layer may be formed under the first conductive semiconductor layer 20. The buffer layer and/or the non-conductive semiconductor layer can include semiconductor material, composite material, or the combination thereof. The buffer layer and the non-conductive semiconductor layer may include the group III-V semiconductor materials.

The non-conductive semiconductor layer is not doped with conductive dopant, so the non-conductive semiconductor layer has electric conductivity significantly lower than that of the first conductive semiconductor layer 20. For instance, the non-conductive semiconductor layer may be an undoped GaN layer, but the embodiment is not limited thereto.

The buffer layer may relax the lattice mismatch between the first conductive semiconductor layer 20 and the substrate 10.

The first conductive semiconductor layer 20 can include semiconductor material, composite material, or the combination thereof. For instance, the first conductive semiconductor layer 20 may be an N type semiconductor layer including N type dopant. The N type semiconductor layer may include the semiconductor material having the compositional formula of $In_xAl_yGa_{1-x-y}N$ (0≤x≤1, 0≤y≤1, 0≤x+y≤1). For instance, the N type semiconductor layer may include at least one selected from the group consisting of InAlGaN, GaN, AlGaN, InGaN, AlN, InN and AlInN and may be doped with N type dopant, such as Si, Ge or Sn.

The active layer 30 may be formed on the first conductive semiconductor layer 20.

The active layer 30 emits the light having the wavelength corresponding to the bandgap of the energy band according to the intrinsic material for the active layer 30 through the recombination of electrons (or holes) injected through the first conductive semiconductor layer 20 and holes (or electrons) injected through the second conductive semiconductor layer 50.

The active layer 30 may have at least one of a single well structure, a multiple well (MQW) structure, a quantum dot structure, or a quantum wire structure. The active layer 30 may have the stack structure of well/barrier layers. For example, the active layer 30 can include the group III-V compound semiconductors.

For instance, the active layer 30 may have the stack structure of InGaN well/GaN barrier layers, InGaN well/AlGaN barrier layers or InGaN well/InGaN barrier layers. The bandgap of the barrier layer may be wider than the bandgap of the well layer.

As shown in FIG. 2, the active layer 30 according to the embodiment has the MQW structure.

Referring to FIG. 2, the active layer 30 can be formed by alternately stacking a plurality of well layers 32 and barrier layers 34 and 36 on the first conductive semiconductor layer 20. For instance, the first well layer 32 is formed on the first conductive semiconductor layer 20, the first barrier layer 34 is formed on the first well layer 32, the second well layer 32 is formed on the first barrier layer 34, the second barrier layer 34 is formed on the second well layer 32, the third well layer 32 is formed on the second barrier layer 34, and the third barrier layer 36 is formed on the third well layer 32. That is, the well layers 32 and the barrier layers 34 and 36 are sequentially formed on the first conductive semiconductor layer 20 as described above.

Thus, the electrons supplied from the first conductive semiconductor layer 20 is recombined with the holes supplied from the second conductive semiconductor layer 50 at the active layer 30 having the MQW structure, so that the active layer 30 can generate the light.

In general, mobility of the electrons is very faster than that of the holes. Thus, if the first conductive semiconductor layer 20 includes the P type dopant and the second conductive semiconductor layer 50 includes the N type dopant, the electrons may be rapidly supplied to the active layer 30 from the first conductive semiconductor layer 20, but the holes may be slowly supplied to the active layer 30 from the second conductive semiconductor layer 50. Therefore, the amount of the electrons is relatively greater than the amount of the holes in the active layer 30, and the some electrons, which are not combined with the holes, may not stay in the active layer 30, but move to the second conductive semiconductor layer 50. As a result, the leakage current may occur due to the electrons moved to the second conductive semiconductor layer 50.

In order to prevent the leakage current caused by the electrons moved to the second conductive semiconductor layer 50, an electron blocking layer 40 may be formed between the active layer 30 and the second conductive semiconductor layer 50.

The electron blocking layer 40 can include semiconductor material, composite material, or the combination thereof. For instance, the electron blocking layer 40 may include the group III-V semiconductor material. In order to prevent the electrons of the active layer 30 from moving to the second conductive semiconductor layer 50, the electron blocking layer 40 may be formed of a semiconductor material having an energy bandgap wider than that of the active layer 30, in detail, the barrier layer of the active layer 30. For instance, the electron blocking layer 40 may include AlGaN or InAlGaN.

The electron blocking layer 40 may be doped with the P type dopant, such as Mg, Zn, Ca, Sr, or Ba.

Due to the electron blocking layer 40 having the energy bandgap wider than that of the barrier layer of the active layer 30, the amount of electrons moved to the second conductive semiconductor layer 50 may be reduced.

However, in spite of the electron blocking layer 40, some of the electrons of the active layer 30 may be moved to the second conductive semiconductor layer 50 through the electron blocking layer 40.

In detail, if the current applied to the light emitting device is increased, a greater amount of electrons and holes may be supplied to the active layer 30. However, each well layer 32 of the active layer 30 does not infinitively receive the electrons and holes. In other words, the each well layer 32 of the active layer 30 can receive only a limited amount of the electrons and holes.

Thus, even if a greater amount of electrons and holes are supplied to the active layer 30 due to the increment of the current applied to the light emitting device, the well layer 32 of the active layer 30 may receive only a limited amount of the electrons and holes, so extra electrons and holes, which do not enter the active layer 30, may exist. In particular, since the mobility of the electrons is very faster than that of the holes, the amount of extra electrons is relatively greater than the amount of the extra holes.

The extra electrons may be extinct naturally or moved to the second conductive semiconductor layer 50 by way of the electron blocking layer 40, thereby causing the leakage current.

Meanwhile, as described above, the active layer 30 is formed by alternately stacking a plurality of well layers 32 and barrier layers 34 and 36 on the first conductive semiconductor layer 20.

At this time, the barrier layer 36, other than the well layer 32, may be adjacent to the electron blocking layer 40. In the following description, this barrier layer will be referred to as an outermost barrier layer 36.

If there is no electron blocking layer 40, the outermost barrier layer 36 may be aligned adjacent to the second conductive semiconductor layer 50 including the P type dopant, which will be described later. In this manner, if the outermost barrier layer 36 is aligned adjacent to the electron blocking layer 40 or the second conductive semiconductor layer 50, the electrons of the active layer 30 moving to the second conductive semiconductor layer 50 may be blocked by the outermost barrier layer 36.

The outermost barrier layer 36 prevents desorption of indium (In) while preventing the dopant included in the electron blocking layer 40, for instance, magnesium (Mg), from diffusing into the active layer 30.

However, since there is great mismatch between the outermost barrier layer 36 and the electron blocking layer 40, an internal field may exist at the interfacial surface between the outermost barrier layer 36 of the active layer 30 and the electron blocking layer 40 due to the positive (+) charges. The internal field may lower the barrier height of the electron blocking layer 40, so the electrons of the active layer 30 may be readily moved to the second conductive semiconductor layer 50 through the electron blocking layer 40, thereby causing the leakage current.

The outermost barrier layer 36 may have the thickness equal to or different from the thickness of other barrier layers 34.

According to the embodiment, as shown in FIGS. 3 and 4, the outermost barrier layer 36 of the active layer 30 can be formed by alternately stacking a plurality of first and second layers 36b and 36a.

In other words, the outermost barrier layer 36 may include a plurality of first and second layers 36b and 36a, which are alternately stacked.

For instance, the first layer 36b is formed on the outermost well layer 32 of the active layer 30, the second layer 36a is formed on the first layer 36b, another first layer 36b is formed on the second layer 36a, and another second layer 36a is formed on another first layer 36b. In this manner, the first and second layers are alternately stacked to form the outermost barrier layer 36.

The outermost well layer 32 refers to the well layer adjacent to the outermost barrier layer 36 from among the well layers of the active layer 30.

Since the outermost barrier layer 36 includes the first and second layers 36b and 36a, an effective barrier height 100 of the outermost barrier layer 36 becomes high, so that the electrons of the active layer 30 can be prevented from moving to the electron blocking layer 40, thereby suppressing the leakage current.

The effective barrier height 100 refers to the actual barrier height of the outermost barrier layer 36 formed by the first and second layers 36b and 36a.

As shown in the drawings, in the structural aspect, the bandgap Eg1 of the first layers 36b is substantially similar to the bandgap Eg0 of the barrier layer 34, other than the bandgap of the outermost barrier layer 36 of the active layer 30. However, due to the first and second layers 36b and 36a, the bandgap Eg3 of the effective barrier height 100 of the outermost barrier layer 36 is wider than the bandgap Eg0 of the barrier layer 34, other than the bandgap of the outermost barrier layer 36, and similar or equal to the bandgap Eg4 of the electron blocking layer 40.

Therefore, if the outermost barrier layer 36 includes the first and second layers 36b and 36a, the bandgap Eg3 of the outermost barrier layer 36 is substantially equal to the bandgap Eg4 of the electron blocking layer 40.

In addition, due to the outermost barrier layer 36 including the first and second layers 36b and 36a, the lattice mismatch may be relaxed between the outermost barrier layer 36 and the electron blocking layer 40, so the strain may be reduced.

The first layers 36b of the outermost barrier layer 36 may have the thickness equal to or different from the thickness of the second layers 36a of the outermost barrier layer 36.

In addition, the first layers 36b of the outermost barrier layer 36 may have the barrier height equal to or different from the barrier height of the second layers 36a of the outermost barrier layer 36.

Further, the first layers 36b of the outermost barrier layer 36 may have the bandgap different from the bandgap of the second layers 36a of the outermost barrier layer 36. That is, the bandgap Eg1 of the first layers 36b may be wider than the bandgap Eg2 of the second layers 36a.

Figure 5:
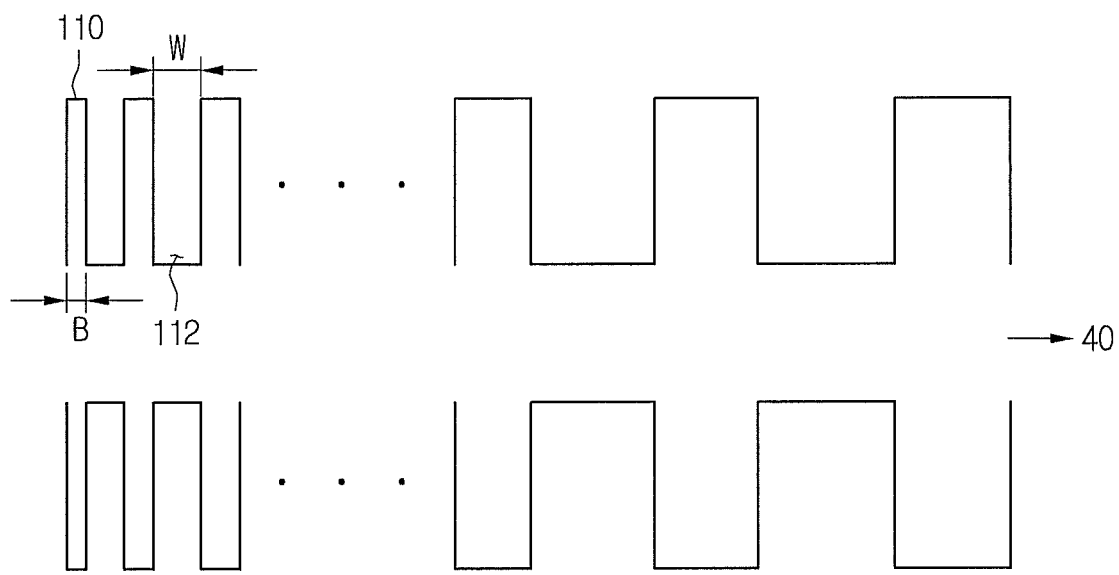
FIG. 5 is an energy band diagram of an outermost barrier of an active layer according to the first embodiment.

As shown in FIG. 5, thickness B of first layers 110 may be gradually increased from the outermost well layer 32 of the active layer 30 to the electron blocking layer 40, and thickness W of second layers 112 may be gradually increased from the outermost well layer 32 of the active layer 30 to the electron blocking layer 40.

Figure 6:
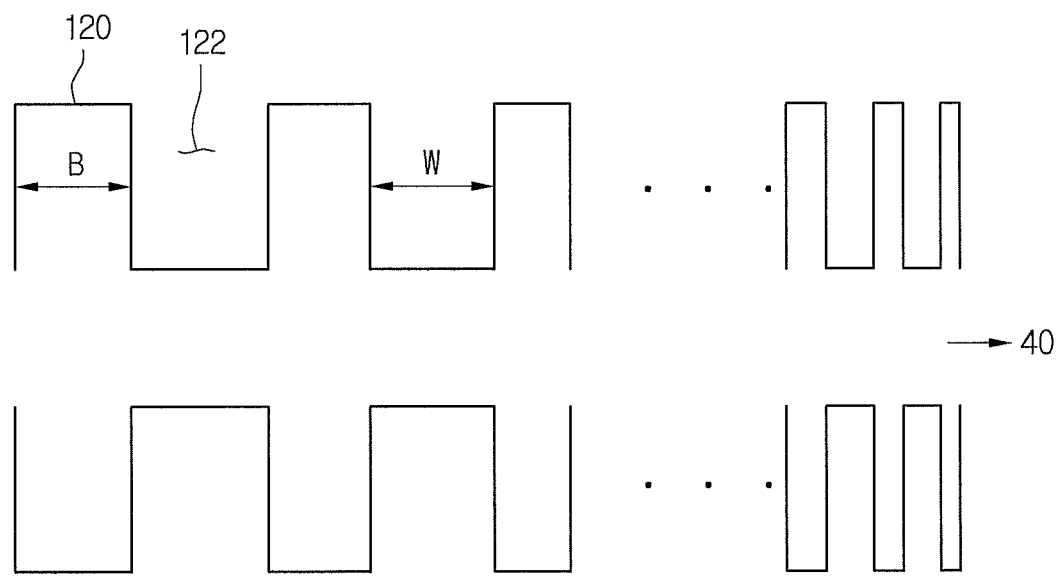
FIG. 6 is an energy band diagram of an outermost barrier of an active layer according to the second embodiment.

In addition, as shown in FIG. 6, thickness B of first layers 120 may be gradually reduced from the outermost well layer 32 of the active layer 30 to the electron blocking layer 40, and thickness W of second layers 122 may be gradually reduced from the outermost well layer 32 of the active layer 30 to the electron blocking layer 40.

Figure 7:
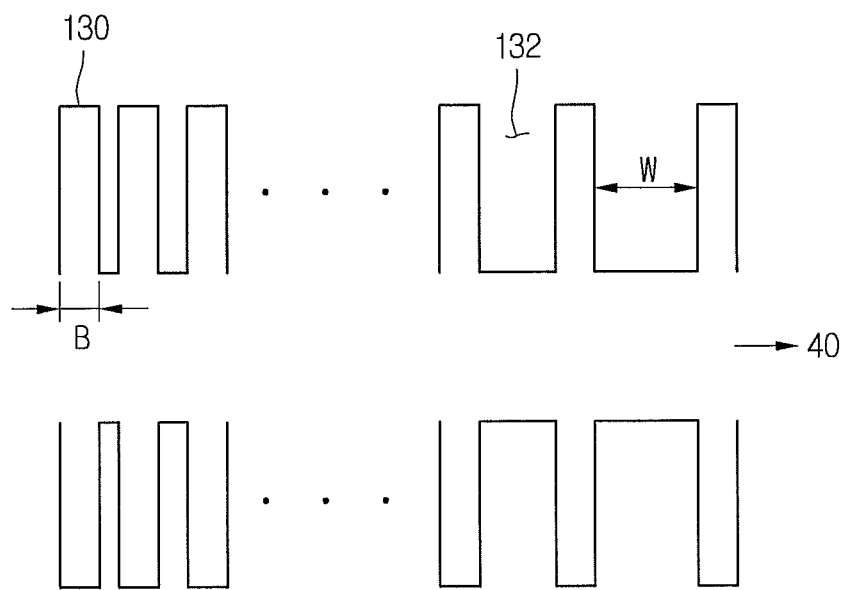
FIG. 7 is an energy band diagram of an outermost barrier of an active layer according to the third embodiment.

Further, as shown in FIG. 7, first layers 130 may have the same thickness B, and thickness W of second layers 132 may be gradually increased from the outermost well layer 32 of the active layer 30 to the electron blocking layer 40.

Figure 8:
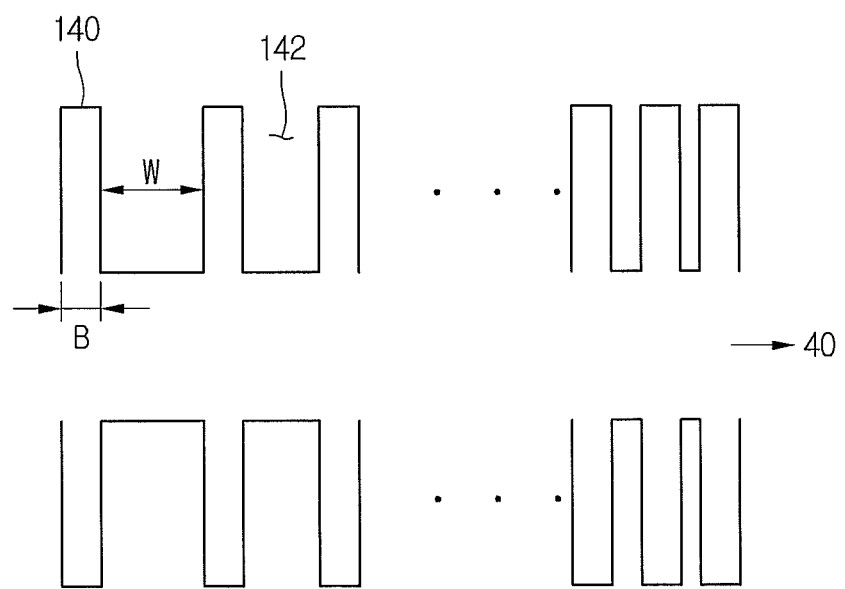
FIG. 8 is an energy band diagram of an outermost barrier of an active layer according to the fourth embodiment.

In addition, as shown in FIG. 8, first layers 140 may have the same thickness B, and thickness W of second layers 142 may be gradually reduced from the outermost well layer 32 of the active layer 30 to the electron blocking layer 40.

Figure 9:
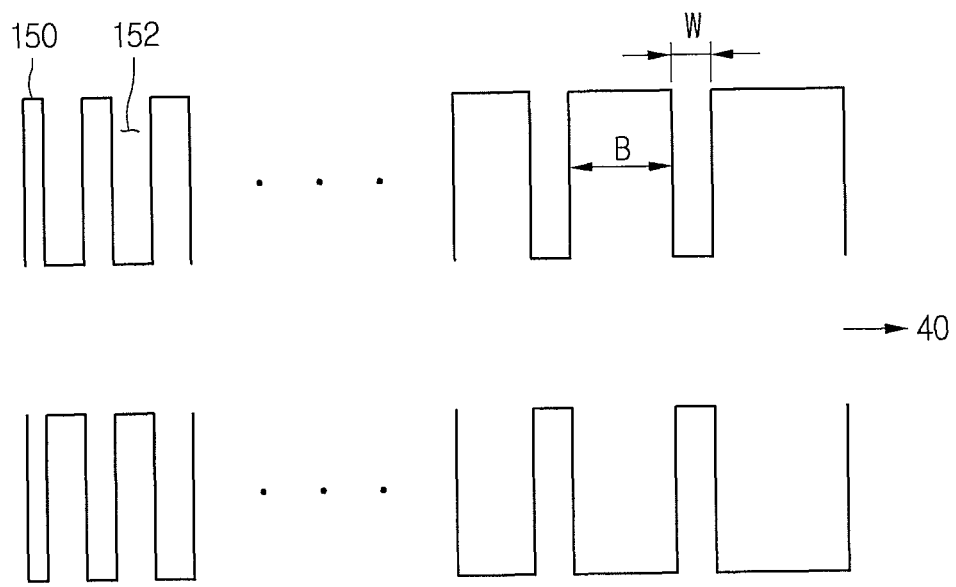
FIG. 9 is an energy band diagram of an outermost barrier of an active layer according to the fifth embodiment.

Further, as shown in FIG. 9, thickness B of first layers 150 may be gradually increased from the outermost well layer 32 of the active layer 30 to the electron blocking layer 40, and second layers 152 may have the same thickness W.

Figure 10:
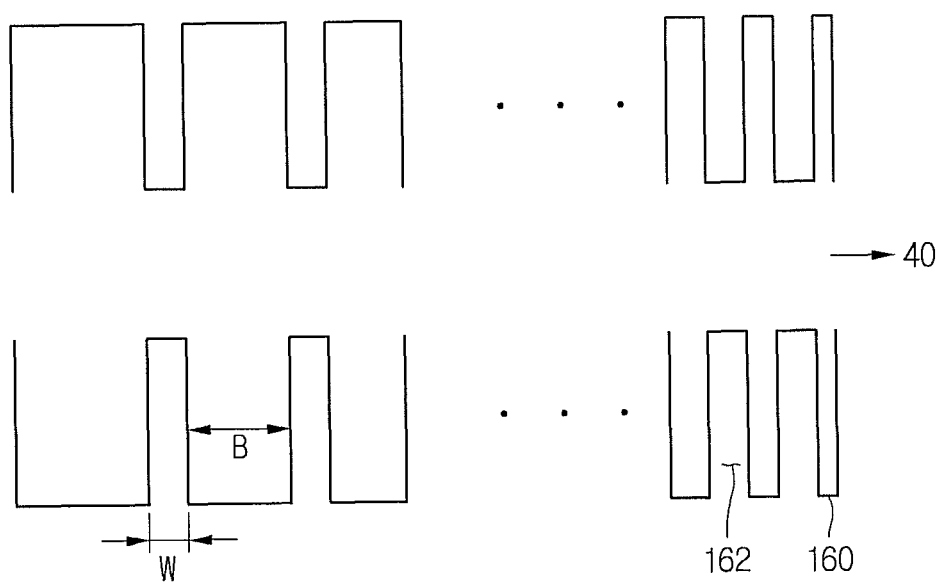
FIG. 10 is an energy band diagram of an outermost barrier of an active layer according to the sixth embodiment.

As shown in FIG. 10, thickness B of first layers 160 may be gradually reduced from the outermost well layer 32 of the active layer 30 to the electron blocking layer 40, and second layers 162 may have the same thickness W.

Figure 11:
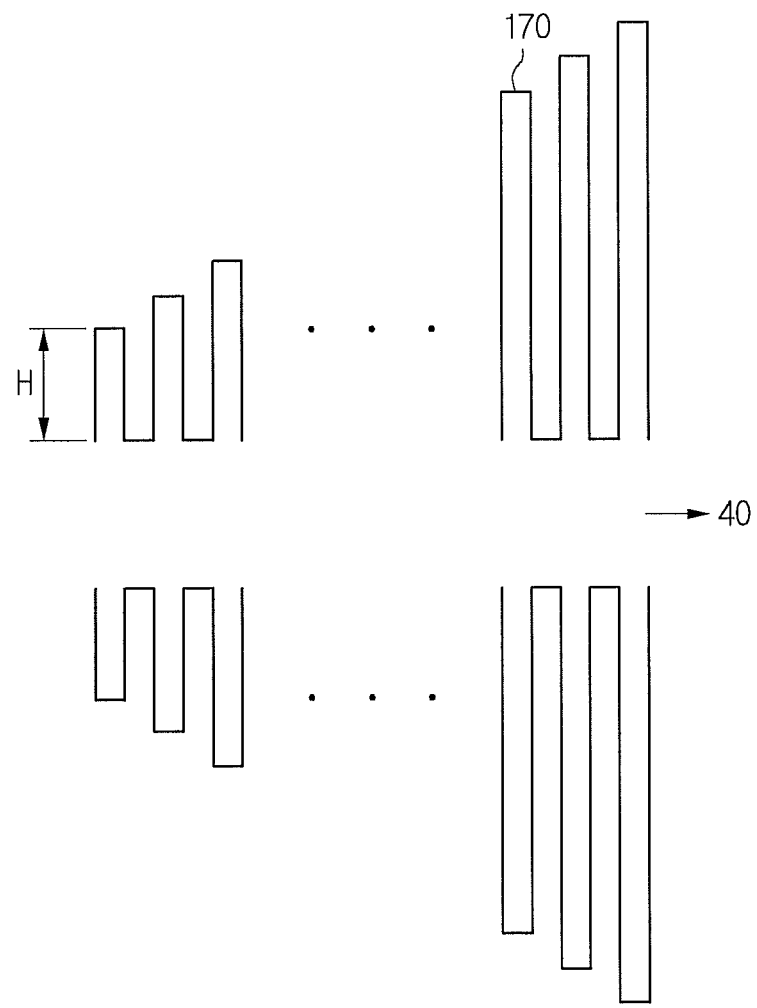
FIG. 11 is an energy band diagram of an outermost barrier of an active layer according to the seventh embodiment.

As shown in FIG. 11, barrier heights H of first layers 170 may be gradually increased from the outermost well layer 32 of the active layer 30 to the electron blocking layer 40.

Figure 12:
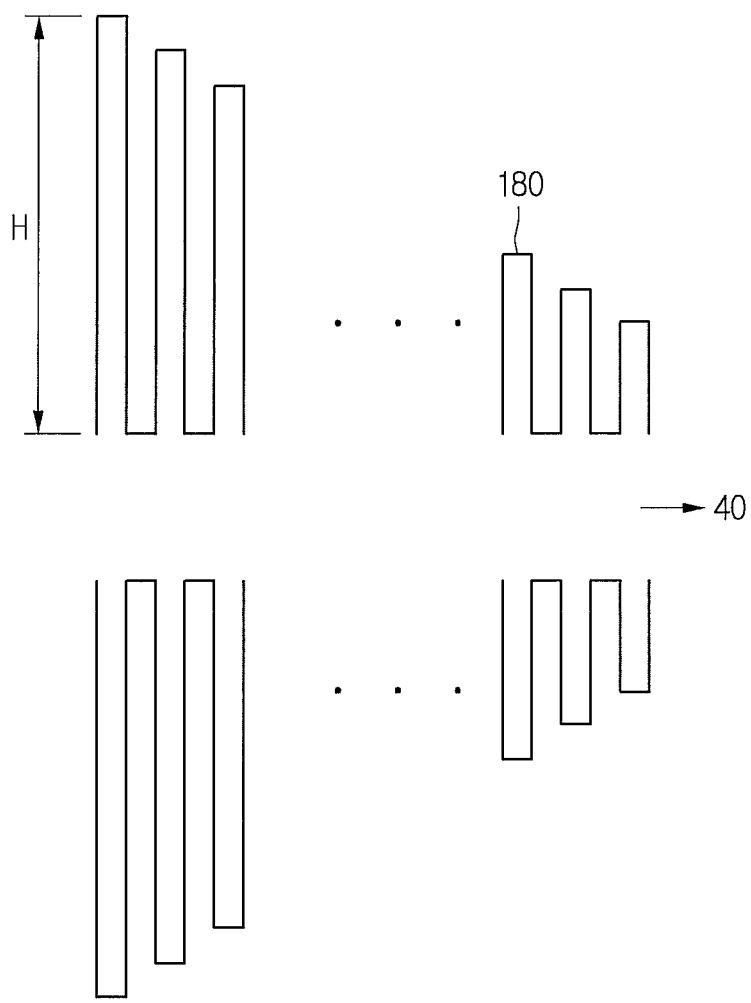
FIG. 12 is an energy band diagram of an outermost barrier of an active layer according to the eighth embodiment.

As shown in FIG. 12, barrier heights H of first layers 180 may be gradually reduced from the outermost well layer 32 of the active layer 30 to the electron blocking layer 40.

In the meantime, as not shown in any figure, the outermost barrier layer 32 comprises a super lattice structure consisting of repeatedly alternating the first layer and the second layer.

Referring to FIG. 1, the second conductive semiconductor layer 50 is formed on the active layer 30. For instance, the second conductive semiconductor layer 50 may be a P type semiconductor layer including P type dopant. The second conductive semiconductor layer 50 may include a plurality of layers having various compositions and configurations. The P type semiconductor layer may include the semiconductor material having the compositional formula of $In_xAl_yGa_{1-x-y}N$ ($0 \leq x \leq 1$, $0 \leq y \leq 1$, $0 \leq x+y \leq 1$). For instance, the P type semiconductor layer may include at least one selected from the group consisting of InAlGaN, GaN, AlGaN, InGaN, AlN, InN and AlInN and may be doped with P type dopant, such as Mg, Zn, Ca, Sr, or Ba.

Although not shown in the drawings, a transparent electrode layer may be formed on the second conductive semiconductor layer 50. The transparent electrode layer may include a material having superior electric conductivity and transmittance. The transparent electrode layer may include one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO.

Meanwhile, a reflective electrode layer (not shown) can be formed instead of the transparent electrode layer. The reflective electrode layer may include one selected from the group consisting of Ag, Al, Pt and Pd having the superior reflective efficiency.

Although not shown in the drawings, a first electrode (not shown) may be formed on the second conductive semiconductor layer 50. In addition, a second electrode (not shown) may be formed on a local exposed region of the first conductive semiconductor layer 20. The first and second electrodes supply power to the light emitting device 1.

The first conductive semiconductor layer 20 may be exposed through the mesa etching process before the second electrode is formed.

Hereinafter, description will be made with reference to the comparative example including the outermost barrier layer of the active layer without the first and second layers, and the embodiment including the outermost barrier layer of the active layer having the first and second layers.

FIGS. 13a to 18 will be described with reference to FIGS. 1 to 4.

Figure 13A:
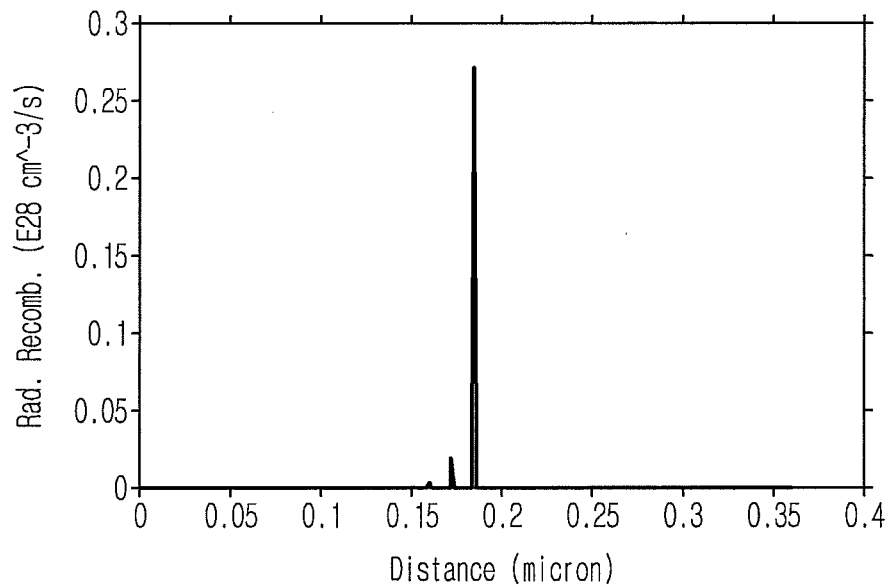
FIGS. 13a and 13b are graphs showing light emitting intensities of the embodiment and the comparative example.
Figure 13B:
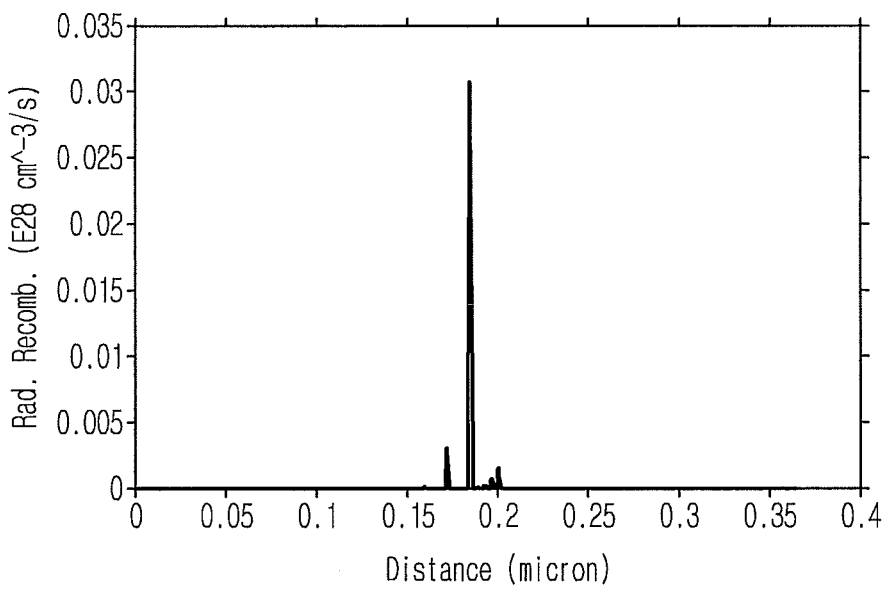

FIGS. 13a and 13b are graphs showing light emitting intensities of the embodiment and the comparative example.

The light emitting intensity of the embodiment (FIG. 13b) is higher than the light emitting intensity of the comparative example (FIG. 13a). In the case of the embodiment, the light is generated by second layers 36a serving as well layers of the outermost barrier layer 36 of the active layer 30.

A greater amount of lights is generated in the embodiment (FIG. 13b) as compared with the comparative example (FIG. 13a).

Figure 14A:
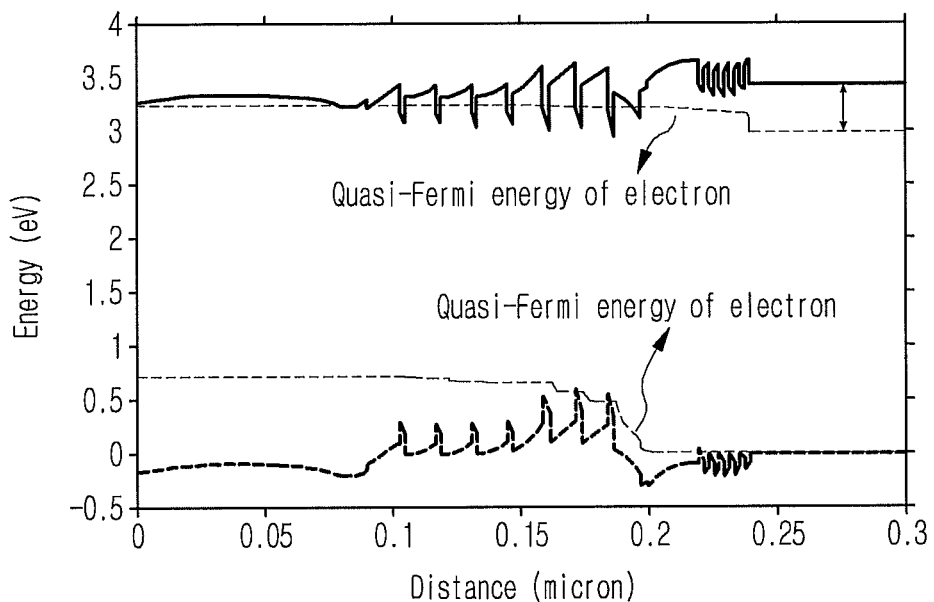
FIGS. 14a and 14b are energy band diagrams of light emitting devices according to the embodiment and the comparative example.
Figure 14B:
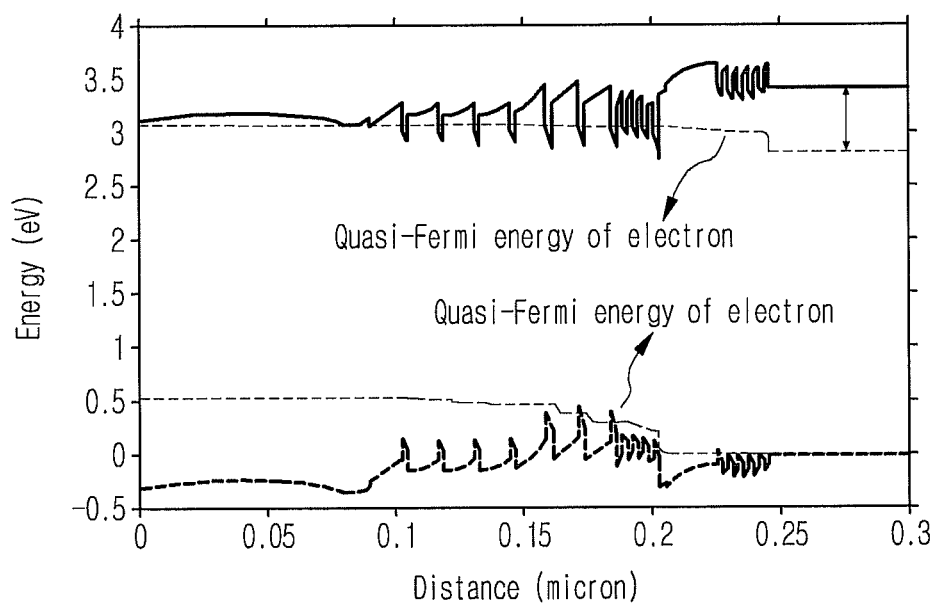

FIGS. 14a and 14b are energy band diagrams of light emitting devices according to the embodiment and the comparative example.

As shown in FIGS. 14a and 14b, the embodiment represents the higher barrier height at the outermost barrier layer 36 of the active layer 30 as compared with the comparative example. Thus, according to the embodiment, the electrons of the active layer 30 can be prevented from moving to the electron blocking layer 40 by the outermost barrier layer 36 of the active layer 30, so that the leakage current is reduced and the light emitting efficiency is improved.

Figure 15:
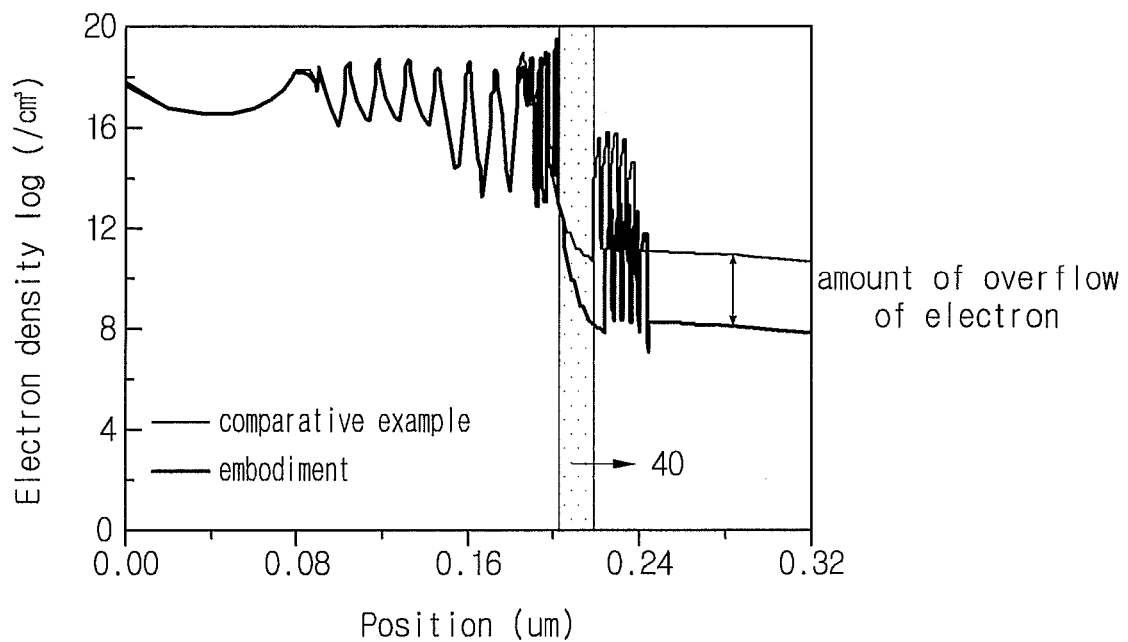
FIG. 15 is a graph showing distribution of electron density of light emitting devices according to the embodiment and the comparative example.

As shown in FIG. 15, the electron density at the electron blocking layer 40 according to the embodiment is significantly lower than that of the comparative example.

Figure 16:
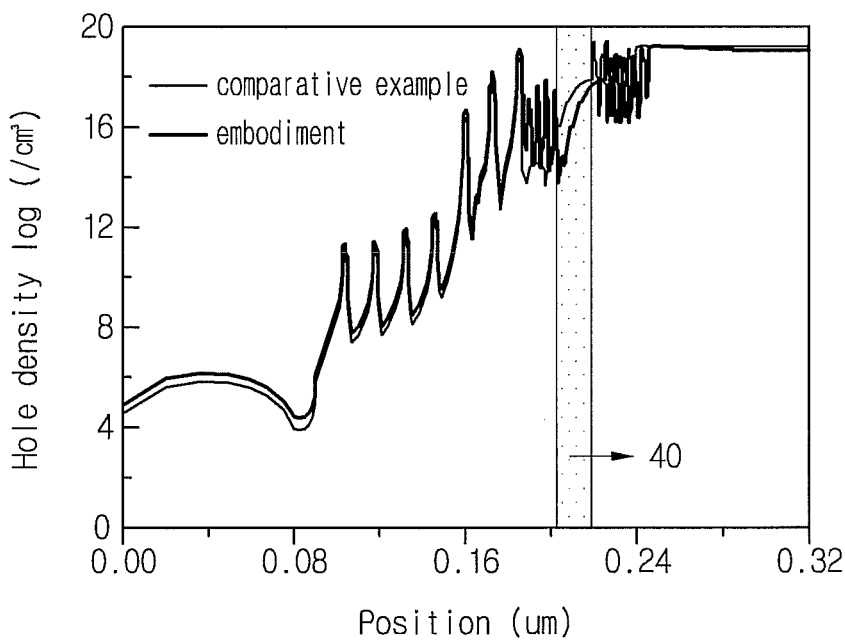
FIG. 16 is a graph showing distribution of hole density of light emitting devices according to the embodiment and the comparative example.

As shown in FIG. 16, the hole density at the first conductive semiconductor layer 20 according to the embodiment is slightly lower than that of the comparative example.

Thus, as can be understood from FIGS. 15 and 16, the electrons of the active layer 30 can be prevented from moving to the electron blocking layer 40 by the first and second layers 36b and 36a of the outermost barrier layer 36, so that the leakage current can be reduced and the light emitting efficiency can be improved.

Figure 17:
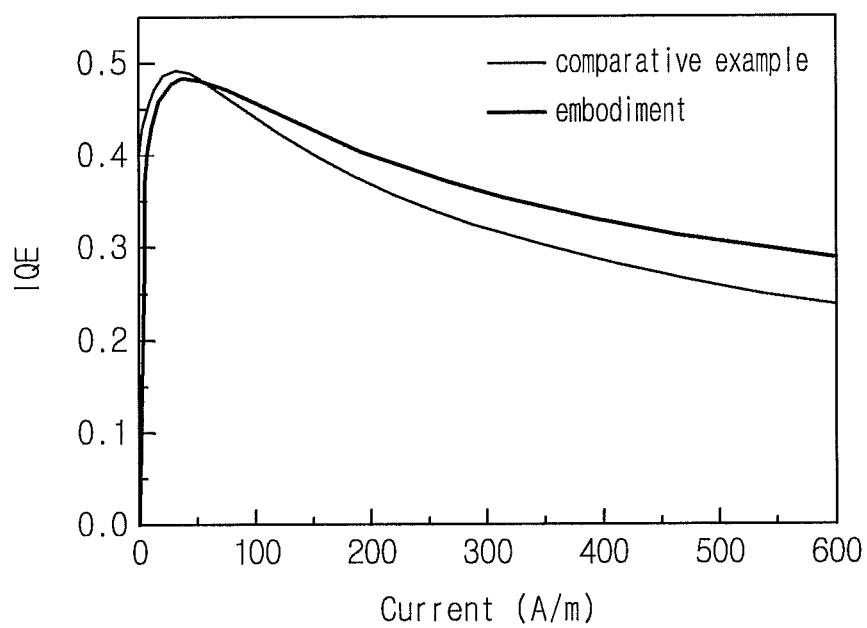
FIG. 17 is a graph showing the internal quantum efficiency of the embodiment and the comparative example.

FIG. 17 is a graph showing the internal quantum efficiency of the embodiment and the comparative example.

As shown in FIG. 17, the internal quantum efficiency is increased in the embodiment as compared with the comparative example.

Figure 18:
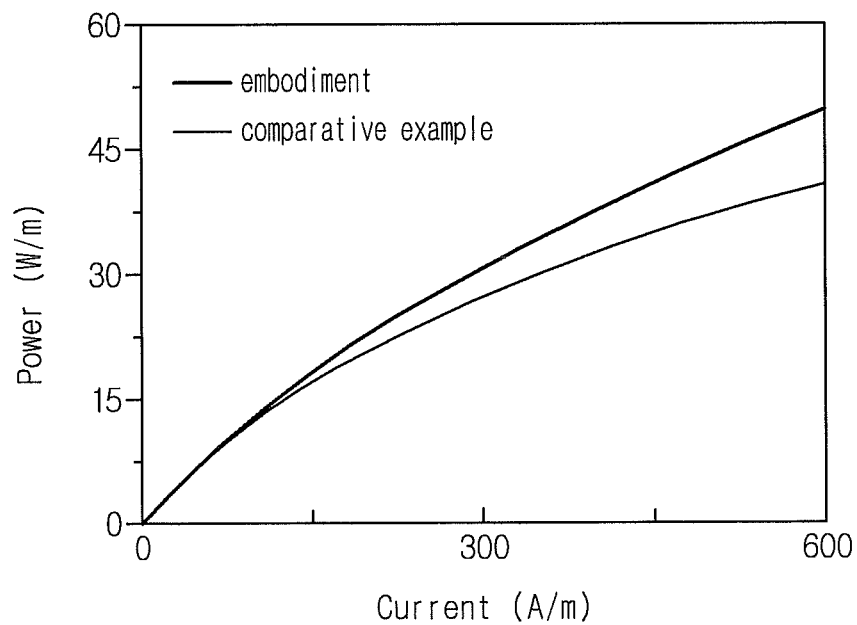
FIG. 18 is a graph showing the light emitting power of the embodiment and the comparative example.

FIG. 18 is a graph showing the light emitting power of the embodiment and the comparative example.

As shown in FIG. 18, the light emitting power is increased in the embodiment as compared with the comparative example. In particular, the light emitting power is more increased as the current is increased.

Thus, as can be understood from FIGS. 17 and 18, according to the embodiment, the light emitting efficiency and the light emitting power can be increased due to the first and second layers 36b and 36a of the outermost barrier layer 36. In addition, the light emitting power can be more increased as the current is increased.

Figure 19:
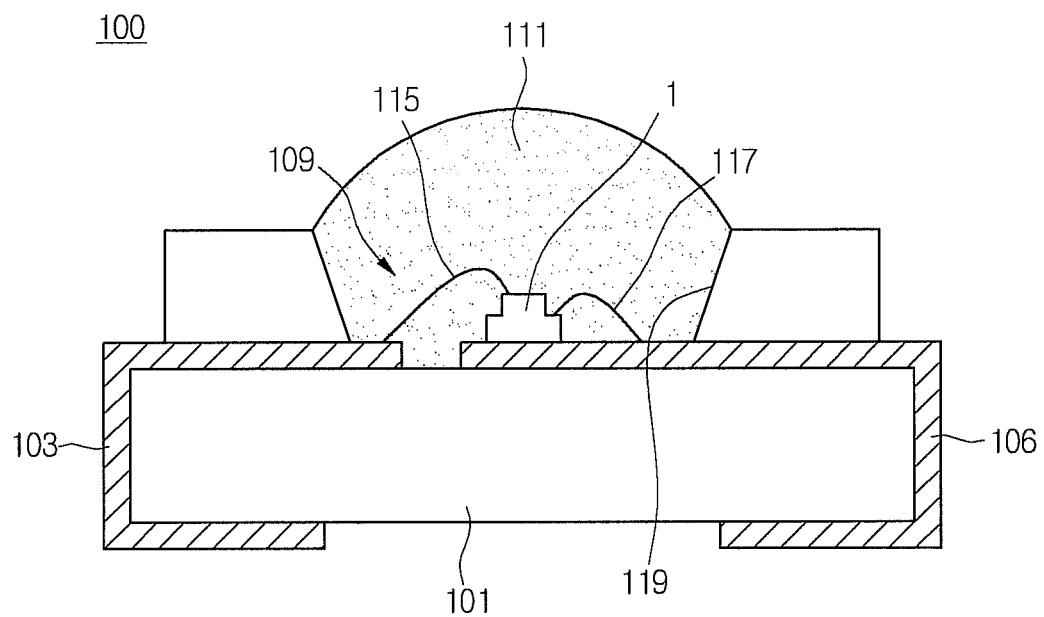
FIG. 19 is a sectional view showing a light emitting device package including a light emitting device according to the embodiment.

FIG. 19 is a sectional view showing a light emitting device package including the light emitting device according to the embodiment.

The light emitting device package 100 includes a body 101, first and second electrode layers 103 and 106 formed on the body 101, the light emitting device 1 provided on the body 20 and electrically connected to the first and second electrode layers 103 and 106 and a molding member 111 that surrounds the light emitting device 1.

The body 101 may include silicon, synthetic resin or metallic material. When viewed from the top, the body 101 is formed with a cavity 109 having an inclined inner wall 119.

The first and second electrode layers 103 and 106 are electrically isolated from each other and extend by passing through the body 101. In detail, one end portions of the first and second electrode layers 103 and 106 are disposed in the cavity 109 and the other end portions of the first and second electrode layers 103 and 106 are attached to the outer surface of the body 101 and exposed to the outside.

The first and second electrode layers 103 and 106 supply power to the light emitting device 1 and reflect the light emitted from the light emitting device 1 to improve the light efficiency. The first and second electrode layers 103 and 106 may dissipate heat generated from the light emitting device 1 to the outside.

The light emitting device 1 is installed on the body 101 or the first or second electrode layer 103 or 106.

In detail, first and second wires 115 and 117 of the light emitting device 1 are electrically connected to one of the first and second electrode layers 103 and 106, but the embodiment is not limited thereto.

The molding member 111 surrounds the light emitting device 1 to protect the light emitting device 1 from external impact. In addition, the molding member 111 may include luminescence materials to change the wavelength of the light emitted from the light emitting device 1.

The light emitting device or the light emitting device package according to the embodiment can be applied to the light unit. The light unit has a structure in which a plurality of light emitting devices or a plurality of light emitting device packages are arrayed. The light unit may include a display device and a lighting device. In addition, the light unit may include an illumination lamp, a signal lamp, a headlight of a vehicle, and an electric signboard.

According to the embodiment, since the outermost barrier layer of the active layer includes a plurality of first and second layers, the barrier height of the outermost barrier layer becomes high, so that the electrons of the active layer can be prevented from moving to the electron blocking layer, thereby suppressing the leakage current.

According to the embodiment, the lattice mismatch may be relaxed between the outermost barrier layer and the electron blocking layer due to the outermost barrier layer of the active layer including a plurality of first and second layers, so that the strain can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a light emitting structure including a first conductive semiconductor layer, a second conductive semiconductor layer, and an active layer between the first conductive semiconductor layer and the second conductive semiconductor layer, and
   an electron blocking layer between the active layer and the second conductive semiconductor layer,
   wherein the active layer includes a plurality of well layers and barrier layers, and
   an outermost barrier layer of the barrier layers includes:
      a plurality of first layers; and
      a plurality of second layers between the plurality of first layers in an alternating manner,
      wherein a lowermost layer of the outermost barrier layer is one of the first layers, and an uppermost layer of the outermost barrier layer is one of the first layers, the first layer that is the lowermost layer of the outermost barrier layer contacts one of the well layer, and the first layer that is the uppermost layer of the outermost barrier layer contacts the electron blocking layer,
      wherein a bandgap of the first layer of the outermost barrier layer is wider than a bandgap of the second layer of the outermost barrier layer,
      wherein the plurality of first layers have different bandgaps from each other,
      wherein a bandgap of the second layer of the outermost barrier layer is substantially same as a bandgap of the well layer, and the bandgap of the second layer of the outermost barrier layer is smaller than a bandgap of the electron blocking layer,
      wherein the effective bandgap of the outermost barrier layer is substantially equal to the bandgap of the electron blocking layer.

2. The semiconductor light emitting device of claim 1, wherein the second conductive semiconductor layer includes a p-type dopant.

3. The semiconductor light emitting device of claim 2, wherein the electron blocking layer has a bandgap at least equal to or wider than a bandgap of the barrier layers of the active layer.

4. The semiconductor light emitting device of claim 1, wherein the first layers are different from the second layers in thickness, respectively.

5. The semiconductor light emitting device of claim 1, wherein the first layers are different from the second layers in bandgaps, respectively.

6. The semiconductor light emitting device of claim 1, wherein the first layers have a same thickness, and the second layers are changed in thickness.

7. The semiconductor light emitting device of claim 1, wherein the first layers are changed in thickness, and the second layers have a same thickness.

8. The semiconductor light emitting device of claim 1, wherein the first layers are changed in thickness, and the second layers are changed in thickness.

9. The semiconductor light emitting device of claim 1, wherein the first layers have a same thickness, and the second layers have a same thickness.

10. The semiconductor light emitting device of claim 1, wherein the first layers have a same barrier height, and the second layers are changed in barrier height.

11. The semiconductor light emitting device of claim 1, wherein the first layers are changed in barrier height, and the second layers have a same barrier height.

12. The semiconductor light emitting device of claim 1, wherein the first layers are changed in barrier height, and the second layers are changed in barrier height.

13. The semiconductor light emitting device of claim 1, wherein the first layers have a same barrier height, and the second layers have a same barrier height.

14. The semiconductor light emitting device of claim 1, wherein the plurality of first layers have different bandgaps from each other between a bandgap of the well layer and a bandgap of the electron blocking layer.

15. The semiconductor light emitting device of claim 1, wherein the plurality of first layers are varied with each other between a bandgap of the well layer and a bandgap of the electron blocking layer.

16. The semiconductor light emitting device of claim 1, wherein the lowermost layer of the outermost barrier layer has a bandgap between a bandgap of the well layer and a bandgap of the barrier layer other than the outermost barrier layer, and the uppermost layer of the outermost barrier layer has a bandgap between the bandgap of the barrier layer other than the outermost barrier layer and a bandgap of the electron blocking layer.

17. The semiconductor light emitting device of claim 1, wherein the lowermost layer of the outermost barrier layer has a bandgap between a bandgap of the barrier layer other than the outermost barrier layer and a bandgap of the electron blocking layer, and the uppermost layer of the outermost barrier layer has a bandgap between a bandgap of the well layer and a bandgap of the barrier layer other than the outermost barrier layer.

18. A semiconductor light emitting device comprising:
    a light emitting structure including a first conductive semiconductor layer, a second conductive semiconductor layer, and an active layer between the first conductive semiconductor layer and the second conductive semiconductor layer, and an electron blocking layer between the active layer and the second conductive semiconductor layer, wherein the active layer includes a plurality of well layers and barrier layers, and an outermost barrier layer of the barrier layers includes:
 a plurality of first layers; and
 a plurality of second layers having bandgaps different from that of the first layer, and the plurality of second layers being provided between the plurality of first layers in an alternating manner, wherein a lowermost layer of the outermost barrier layer is one of the first layers, and an uppermost layer of the outermost barrier layer is one of the first layers, the first layer that is the lowermost layer of the outermost barrier layer contacts one of the well layers, and the first layer that is the uppermost layer of the outermost barrier layer contacts the electron blocking layer, wherein a bandgap of the first layer of the outermost barrier layer is wider than a bandgap of the second layer of the outermost barrier layer, wherein the plurality of first layers have different bandgaps from each other, wherein a bandgap of the second layer of the outermost barrier layer is substantially same as a bandgap of the well layer, and the bandgap of the second layer of the outermost barrier layer is smaller than a bandgap of the electron blocking layer, wherein the effective bandgap of the outermost barrier layer is substantially equal to the bandgap of the electron blocking layer.

19. The semiconductor light emitting device of claim 18, wherein the second conductive semiconductor layer includes a p-type dopant.

20. The semiconductor light emitting device of claim 18, wherein the first layer and the second layer are each positioned in a bandgap between a bandgap of the well layer and a bandgap of the electron block layer.

21. The semiconductor light emitting device of claim 18, wherein the first layer has the same bandgap as that of the barrier layer other than the outermost barrier layer.

22. The semiconductor light emitting device of claim 18, wherein the electron blocking layer has a bandgap at least equal to or wider than a bandgap of the barrier layers of the active layer.

23. The semiconductor light emitting device of claim 18, wherein the outermost barrier layer comprises a super lattice structure consisting of repeatedly alternating the first layer and the second layer.

* * * * *